US009665537B2

(12) United States Patent
Khvoenkova et al.

(10) Patent No.: US 9,665,537 B2
(45) Date of Patent: May 30, 2017

(54) METHOD FOR GENERATING A FRACTURED RESERVOIR MESH WITH A LIMITED NUMBER OF NODES IN THE MATRIX MEDIUM

(71) Applicant: IFP Energies nouvelles, Rueil-Malmaison (FR)

(72) Inventors: Nina Khvoenkova, Rueil-Malmaison (FR); Matthieu Delorme, Rueil-Malmaison (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 659 days.

(21) Appl. No.: 13/644,479

(22) Filed: Oct. 4, 2012

(65) Prior Publication Data
US 2013/0096889 A1 Apr. 18, 2013

(30) Foreign Application Priority Data
Oct. 12, 2011 (FR) ...................................... 11 03112

(51) Int. Cl.
*G06G 7/48* (2006.01)
*G06F 17/10* (2006.01)
(Continued)

(52) U.S. Cl.
CPC .............. *G06F 17/10* (2013.01); *G01V 11/00* (2013.01); *G01V 99/005* (2013.01); *G06F 17/50* (2013.01);
(Continued)

(58) Field of Classification Search
CPC ................ G06F 17/50; G01V 2210/64; G01V 2210/642; G01V 2210/644; G01V 2210/646; G01V 2210/1234
(Continued)

(56) References Cited

U.S. PATENT DOCUMENTS 6,023,656 A 2/2000 Cacas et al.
6,064,944 A 5/2000 Sarda et al.
(Continued)

FOREIGN PATENT DOCUMENTS

EP 2 037 080 A1 3/2009
FR 2 757 947 7/1998
(Continued)

OTHER PUBLICATIONS

Ma, Jinsheng et al., "Construction of Guiding Grids for Flow Modeling in Fault Damage Zones Through-Going Regions of Connected Matrix", 2007, Computers & Geosciences 33, Elsevier, Ltd.*
(Continued)

*Primary Examiner* — Cedric D Johnson
(74) *Attorney, Agent, or Firm* — Fitch, Even, Tabin & Flannery LLP

(57) ABSTRACT

The invention is a method for optimizing the development of a fluid reservoir using a fractured medium mesh generated from a first-order balanced octree technique is disclosed. A mesh of a discrete fracture network generated by defining a set of cells for each fracture and then a mesh of the matrix medium is generated by dividing each cell by an octree technique, wherein a cell is divided into eight cells. The transmissivities between the cells of the fracture mesh, transmissivities between the cells of the matrix medium mesh and transmissivities between cells of the fracture mesh and cells of the matrix medium mesh are then determined. Finally, the cells and the transmissivities are used for generating an image of the fluid reservoir from which the development of the fluid reservoir is optimized.

19 Claims, 6 Drawing Sheets

(51) Int. Cl.
*G06F 17/50* (2006.01)
*G01V 11/00* (2006.01)
*G01V 99/00* (2009.01)

(52) U.S. Cl.
CPC .. *G01V 2210/642* (2013.01); *G01V 2210/646* (2013.01)

(58) Field of Classification Search
USPC .................................................. 703/10, 9, 6
See application file for complete search history.

(56) References Cited

U.S. PATENT DOCUMENTS

| | | | |
|---|---|---|---|
| 6,842,725 B1 | 1/2005 | Sarda | |
| 6,928,399 B1* | 8/2005 | Watts, III | E21B 49/00 702/13 |
| 8,078,405 B2 | 12/2011 | Delorme et al. | |
| 2003/0216898 A1* | 11/2003 | Basquet et al. | 703/10 |
| 2006/0235666 A1 | 10/2006 | Assa et al. | |
| 2011/0015910 A1 | 1/2011 | Ran et al. | |

FOREIGN PATENT DOCUMENTS

| | | |
|---|---|---|
| FR | 2 757 957 | 7/1998 |
| FR | 2 787 219 | 6/2000 |
| FR | 2 948 215 | 1/2011 |
| GB | 2 474 740 A | 4/2011 |

OTHER PUBLICATIONS

Beni, Leila Hashemi et al., Developing an Adaptive Topological Tessellation for 3D Modeling in Geosciences, 2009, Geomatica, vol. 63, No. 4.*

Bogatkov, D. et al., "Characterization of Fracture Network System of the Midale Field", Jun. 12-14, 2007, 8th Canadian International Petroleum Conference, Petroleum Society.*

Sarda, S. et al., "Hydraulic Characterization of Fractured Reservoirs: Simulation on Discrete Fracture Models", Apr. 2002, SPE Reservoir Evaluation and Engineering, Society of Petroleum Engineers.*

Khvoenkova, Nina et al. "An Optimal Method to Model Transient Flows in 3D Discrete Fracture Network", Sep. 5-9, 2011, Mathematical Geosciences at the Crossroads of Theory and Practice, IAMG.*

Blessent, Daniela, "Integration of 3D Geological and Numerical Models Based on Tetrahedral Meshes for Hydrogeological Simulations in Fractured Porous Media", 2009, Universite Laval, Quebec, Canada.*

Chambers, K. T., et al: "Geologic Modeling, Upscaling and Simulation of Faulted Reservoirs Using Faulted Stratigraphic Grids," Proceedings of the SPE Reservoir Simulation Symposium, XX, XX, No. 51889, Feb. 14, 1999 (Feb. 14, 1999), pp. 1-12, XP002215912.

Bennis, C., et al: "Ono More Step in Gocad Stratigraphic Grid Generation Taking into Account Faults and Pinchouts," Proceedings of the NPF/SPE European 3-D Reservoir Modelling Conference, XX, XX, Apr. 16, 1996 (Apr. 16, 1996), pp. 307-316, XP000613094, pp. 1-3.

Ran, Longmin, et al: "Hex-Dominant Mesh Generation for Basin Modeling with Complex Geometry", I O P Conference Series: Materials Science and Engineering, IOP, GB, vol. 10, Jan. 1, 2010 (Jan. 1, 2010), pp. 1-10, XP007918465, ISSN: 1757-8981, DOI: 10.1088/1757-899X/10/1/012085, pp. 3-7.

* cited by examiner

METHOD FOR GENERATING A FRACTURED RESERVOIR MESH WITH A LIMITED NUMBER OF NODES IN THE MATRIX MEDIUM

CROSS REFERENCE TO RELATED APPLICATION

Reference is made to French Application Serial No. 11/03.112, filed Oct. 12, 2011, which application is incorporated herein by reference in its entirety.

BACKGROUND OF THE INVENTION

Field of the Invention

The present invention relates to the development of underground reservoirs, such as hydrocarbon reservoirs comprising a fracture network and in particular, relates to a method for generating a mesh of the matrix medium and generating an image of the reservoir. The invention also relates to a method using the image to optimize management of the development through a prediction of the fluid flows likely to occur through the medium to simulate hydrocarbon production according to various production scenarios.

Description of the Prior Art

The petroleum industry, and more precisely reservoir exploration and development, notably of petroleum reservoirs, requires knowledge of the underground geology as precise as possible to efficiently provide evaluation of reserves, production modelling or development management. Indeed, determining the location of a production well, an injection well, the drilling mud composition, the completion characteristics, selecting a hydrocarbon recovery method (such as waterflooding for example) and the parameters required for implementing the method (such as injection pressure, production flow rate, etc.) requires good knowledge of the reservoir. Knowing the reservoir notably means knowing the petrophysical properties of the subsoil at any point in space and being able to predict the flows likely to occur therein.

The petroleum industry has therefore combined for a long time field (in-situ) measurements with experimental modelling (performed in the laboratory) and/or numerical modelling (using softwares). Petroleum reservoir modelling thus is a technical stage that is essential for any reservoir exploration or development procedure. The goal of such modelling is to provide a description of the reservoir.

Fractured reservoirs are an extreme type of heterogeneous reservoirs comprising two very different media, a matrix medium containing the major part of the oil in place and having a low permeability, and a fractured medium representing less than 1% of the oil in place and which is highly conductive. The fractured medium itself can be complex, with different sets of fractures characterized by their respective density, length, orientation, inclination and opening. The fractured medium is made up of all of the fractures. The matrix medium is made up of the rock around the fractured medium.

Those in charge of the development of fractured reservoirs need to know as precisely as possible the role of fractures. What is referred to as a "fracture" is a plane of discontinuity of very small thickness in relation to the extent thereof, representing a rupture plane of a rock of the reservoir. On the one hand, knowledge of the distribution and of the behavior of these fractures allows optimization of the location and the spacing between wells to be drilled through the oil-bearing reservoir. On the other hand, the geometry of the fracture network conditions the fluid displacement, on the reservoir scale as well as the local scale, where it determines elementary matrix blocks in which the oil is trapped. Knowing the distribution of the fractures is therefore also very helpful at a later stage to reservoir engineers who want to calibrate the models they construct to simulate the reservoirs, in order to reproduce or to predict the past or future production curves. Geoscientists therefore have three-dimensional images of reservoirs allowing location of a large number of fractures.

Thus, in order to reproduce or to predict (i.e. "simulate") the production of hydrocarbons when starting production of a reservoir according to a given production scenario (characterized by the position of the wells, the recovery method, etc.), reservoir engineers use a computing software, referred to as reservoir simulator (or flow simulator), that calculates the flows and the evolution of the pressures within the reservoir represented by the reservoir model (image of the reservoir). The results of these computations enable prediction and optimization of the reservoir in terms of flow rate and/or of amount of hydrocarbons recovered. Calculation of the reservoir behavior according to a given production scenario constitutes a "reservoir simulation".

A mesh of the matrix medium (rock) and a mesh of the fractured medium have to be generated in order to carry out simulations of flows around a well or on the scale of some reservoir cells ($\sim$km$^2$), by taking into account a geologically representative discrete network of fractures. It has to be suited to the geometric (three-dimensional diffuse faults and fractures location) and dynamic heterogeneities since the fractured medium is often much more fluid conducting than the matrix medium. These simulation zones, when fractured, can comprise up to one million fractures whose size ranges from one to several hundred meters, with very variable geometries of dip, azimuth and shape.

This stage is very useful for hydrodynamic calibration of the fracture models. Indeed, the discontinuity of the hydraulic properties (dominant permeability in the fractures and storage capacity in the matrix) often leads to use the double medium approach (homogenized properties) on reservoir models (hectometric cell). These models are based on the assumption that the representative elementary volume (REV) is reached in the cell and that the medium fracturation is high enough to allow homogenization methods to be applied (stochastic fracturation periodicity for example).

Within the context of petroleum reservoir development, discrete flow simulation methods are used, notably for permeability scaling (scale of a reservoir cell) and for dynamic tests (a small zone of interest (ZOI) in relation to the size of the reservoir). The computation times appear to be essential since computation is often carried out sequentially and a large number of times in optimization loops. It is well known that, in the case of dense fracturation (highly connected fractures), analytical methods are applicable whereas, in case of low connectivity indices, numerical simulation on a discrete fracture network (DFN) is necessary.

The numerical model of the matrix of the transmissivities relative to the various objects (diffuse faults, matrix medium cells), has to meet a certain number of double-medium criteria:

be applicable to a large number of fractures (several thousand fractures);

restitute the connectivity of the fracture network;

be evolutionary to account for all the fracture models (several fracturation scales, 3D disordered fractures, sealed faults, time-dependent dynamic properties, etc.);

the shape of the fractures (any plane convex polygon or ellipse) and the intersection heterogeneities between the 3D fractures have to be taken into account upon plane meshing of each fracture;

model the evolution of the pressure field in the "matrix" medium (less conductive and containing more fluid) as a function of the pressure field in the fractures by use of transmissivity terms (matrix/fracture exchange);

the number of simulation nodes, that is the number of pressure unknowns, has to be restricted to be able to use a numerical solver (what is referred to as a node is a volume element of the fracture or matrix medium of unknown pressure value); and be fast and memory efficient (usable on a usual set and not only on a supercomputer).

With such needs, conventional meshes (finite element or finite volume) and the methods derived therefrom for local transmissivity construction are not applicable due to too large a number of nodes required for simulation.

The technique implemented in the FracaFlow™ software (IFP Energies nouvelles, France), which allows these limits to be exceeded using a physical approach based on analytical solutions of plane flow problems, is also known. The fractures are assumed to be constrained by geological beds (they entirely traverse them) and sub-vertical. A fracture is referred to as a constrained bed if it stops on geological bed changes. According to these hypotheses, all the intersections occur on any intermediate plane parallel to the geological layers. In the median plane of each geological bed, the nodes are on the intersections (a point) of the fractures on the plane (a matrix node and a fracture node in the same place). The vertical connections are carried by the fractures traversing several layers and the volumes associated with the nodes are calculated as all of the points (in the 2D plane, propagated vertically to the thickness of the layer) that are the closest to the node (in the medium considered).

This method reaches its limit when the fractures are not bed constrained and/or the dip of the fractures is not vertical. The intersections are in fact no longer present in each intermediate plane and the vertical connectivity can no longer be met. By increasing the number of intermediate planes, the error can be reduced (without ever being exact in the case of sub-horizontal fractures), but the number of nodes increases considerably and exceeds the limits imposed by the solvers.

SUMMARY OF THE INVENTION

In general terms, the invention relates to a method for optimizing the development of a fluid reservoir traversed by a fracture network, wherein said reservoir is discretized into a set of cells, each cell comprising a matrix medium and a fracture medium, and a discrete fracture network (DFN) is constructed in each cell from observations of said reservoir. The method comprises the following stages:

generating a mesh of the discrete fracture network by defining a set of cells for each fracture;

generating a mesh of the matrix medium by dividing each cell by an octree technique, wherein a cell is divided into eight cells, the cells resulting from a division being themselves split in eight, until each cell resulting from a division comprises a number of fractures below or equal to a given threshold;

determining transmissivities between the cells of the fracture mesh, transmissivities between the cells of the matrix medium mesh, and transmissivities between cells of the fracture mesh and cells of the matrix medium mesh;

using the cells and the transmissivities for generating an image of the fluid reservoir; and using the image of the fluid reservoir and a flow simulator implemented with a computer for optimizing the development of the fluid reservoir.

According to the invention, the mesh of the matrix medium can be generated by a first-order balanced octree technique.

According to an embodiment, the cells resulting from a division are themselves split in eight, until each cell resulting from a division comprises a number of fractures below or equal to a given threshold, or until the number of cells is below or equal to a given threshold.

According to the invention, the transmissivities between the cells of the matrix medium mesh and the fracture medium can be determined as a function of a volume of influence of a fracture node i, $\Omega_{M_i}$, defined as all of the points of a cell of the matrix medium mesh whose closest fracture node is fracture node i, and as a function of a average distance $$\langle l_{mFi} \rangle_{\Omega_{M_i}}$$

to fracture node i on $\Omega_{M_i}$, and assuming that no flow circulates between these volumes of influence.

According to an embodiment, each fracture is represented within the discrete fracture network by a polygonal finite plane, which is isotropic regarding its dynamic properties, and the plane can comprise at least one intersection segment corresponding to an intersection between the fracture and another fracture of the network, and the following stages are carried out:

a) constructing a Voronoi diagram on each fracture plane by positioning Voronoi cell centers on the intersection segments; and b) calculating transmissivities between neighboring Voronoi cell centers from a ratio of the surface area of the neighboring cells to the distance between the neighboring cells.

According to this embodiment, the Voronoi cell centers can be positioned on the intersection segments by applying the following rule with each intersection segment being at least discretized by two intermediate Voronoi nodes at each end of the segment and refined in the case of close segments and intersecting segments.

The number of cells can also be limited by assembling the Voronoi cells belonging to the same intersection segment, as long as the cell resulting from the assembly remains connected.

The transmissivity between two cells resulting from the assembly is advantageously equal to the sum of the transmissivities via the boundaries between them according to the flow conservation.

Finally, the intersection segments can be determined by an octree technique wherein a cell is divided into eight cells, the cells resulting from a division being themselves split in eight, until each cell resulting from a division comprises a number of fractures below or equal to a given threshold.

BRIEF DESCRIPTION OF THE DRAWINGS

Other features and advantages of the method according to the invention will be clear from reading the description hereafter of embodiments given by way of non limitative example, with reference to the accompanying figures wherein.

DETAILED DESCRIPTION OF THE INVENTION

Figure 1:
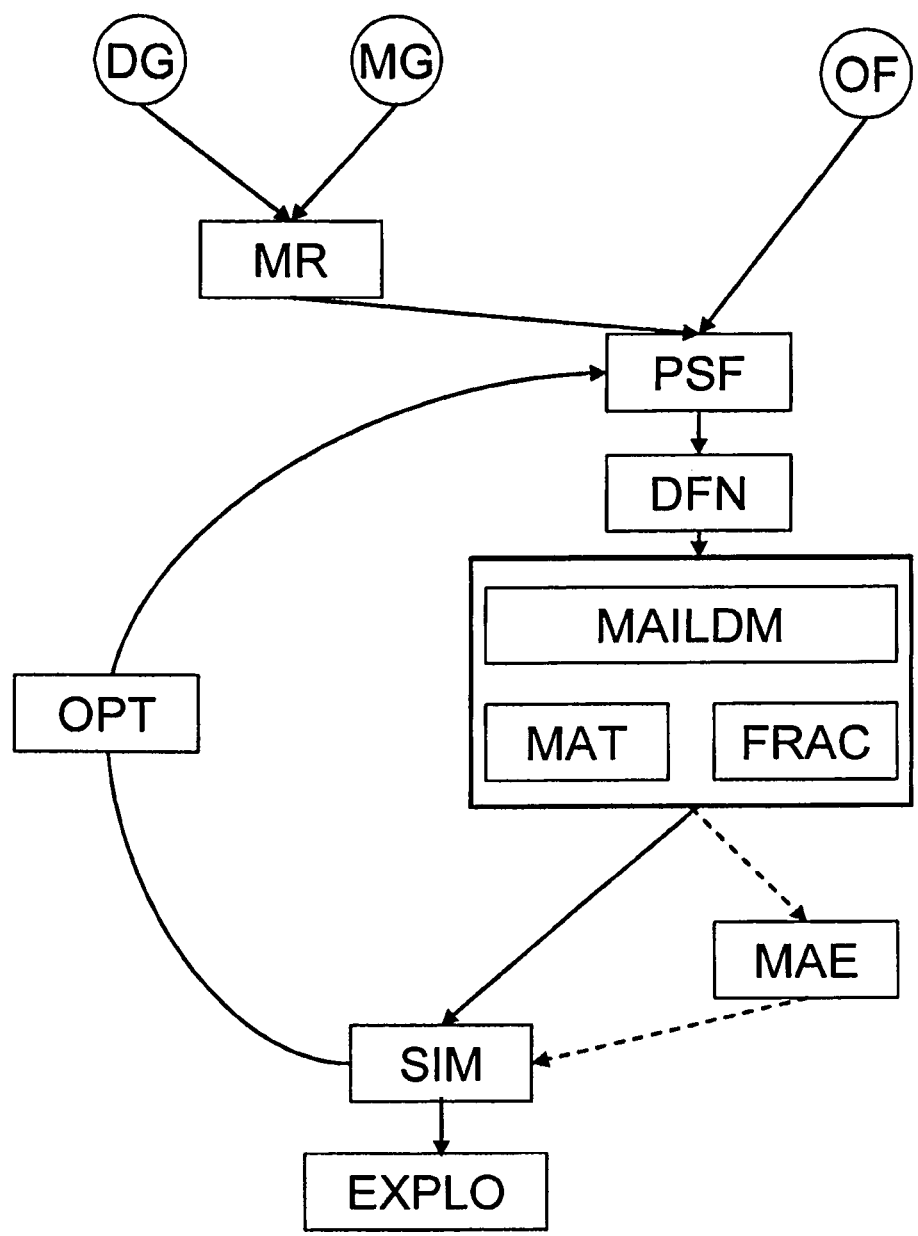
FIG. 1 illustrates the various stages of the method according to the invention.

The method according to the invention for optimizing the development of a reservoir, using the method of generating a matrix medium mesh, comprises six stages with the first four stages being carried out by a computer, as illustrated in FIG. 1:

1—Discretization of the reservoir into a set of cells (MR)
2—Modelling of the fracture network by a discrete fracture network (DFN)
3—Generation of a double medium mesh (MAILDM)
3-a Generation of a fracture medium mesh (FRAC)
3-b Generation of a matrix medium mesh (MAT)
4—Simulation of the fluid flows (SIM)
5—Optimization of the reservoir production conditions (OPT)
6—Optimized (global) development of the reservoir (EXPLO)

1—Discretization of the Reservoir into a Set of Cells (MR)

The petroleum industry has combined for a long time field (in-situ) measurements with experimental modelling (performed in the laboratory) and/or numerical modelling (using softwares). Petroleum reservoir modelling thus is an essential technical stage with a view to reservoir exploration or development. The goal of such modelling is to provide a description of the reservoir, characterized by the structure/geometry and the petrophysical properties of the geological deposits or formations.

This modelling is based on an image of the reservoir generated by discretizing the reservoir into a set of cells (in the description, a cell corresponds to a node). Each cell represents a given volume of the reservoir and makes up an elementary volume of the reservoir. The cells in their entirety make up a discrete image of the reservoir which is referred to as reservoir model.

Many software tools are known allowing construction of a reservoir model from data (DG) and measurements (MG) relative to the reservoir. In the case of fractured reservoirs, the properties in the fracture medium and in the matrix medium are often very heterogeneous. For these heterogeneities to be properly taken into account, a double medium flow model is frequently used.

Figure 2:
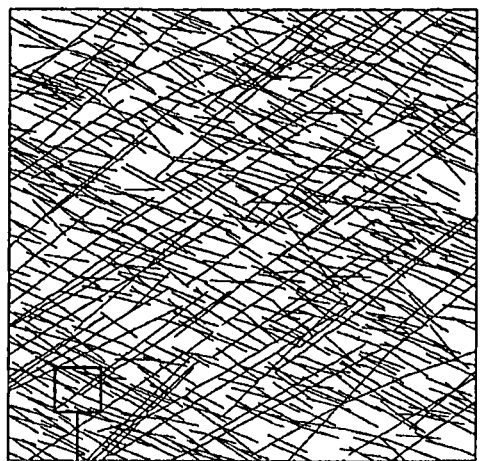
FIG. 2 illustrates a realization of a fracture/fault network on the scale of a reservoir.

FIG. 2 illustrates a two-dimensional view of a reservoir model. The fractures are represented by lines. The cells are not shown.

2—Modelling the Fracture Network

In order to take into account the role of the fracture network in the simulation of flows within the reservoir, it is necessary to associate with each of these elementary volumes (cells of the reservoir model) a modelling of the fracture medium.

Fracture Characterization

Statistical reservoir characterization is carried out by direct and indirect reservoir observations (OF) using 1) well cores extracted from the reservoir, on which a statistical study of the intersected fractures is performed, 2) outcrops characteristic of the reservoir, which afford the advantage of providing a large-scale view of the fracture network, and 3) seismic images allowing them to identify major geological events.

These measurements allow characterization of the fractures by statistical parameters (PSF) of their respective density, length, azimuthal orientation, inclination and opening, and of course their distribution within the reservoir.

At the end of this fracture characterization stage, statistical parameters (PSF) are available describing the fracture networks from which realistic images of the real (geological) networks can be reconstructed (generated) on the scale of each cell of the reservoir model being considered (simulation domain).

The goal of characterization and modelling of the reservoir fracture network is to provide a fracture model validated on the local flows around the wells. This fracture model is then extended to the reservoir scale in order to achieve production simulations. Flow properties are therefore associated with each cell of the reservoir model (MR) (permeability tensor, porosity) of the two media (fracture and matrix).

These properties can be determined either directly from the statistical parameters (PSF) describing the fracture networks, or from a discrete fracture network (DFN) obtained from the statistical parameters (PSF).

Figure 3:
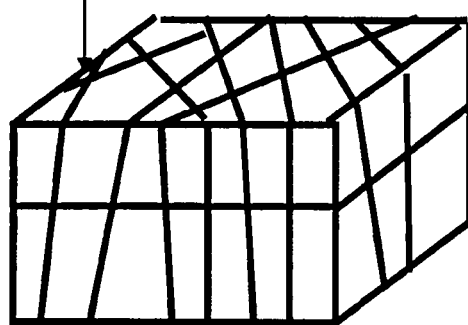
FIG. 3 illustrates a discrete fracture network (DFN)

Constructing a Discrete Fracture Network (DFN)—FIGS. 2 and 3

Starting from a model of the reservoir being studied, a detailed representation (DFN) of the internal complexity of the fracture network, made as accurately as possible in relation to the direct and indirect reservoir observations, is associated therewith in each cell. FIG. 2 illustrates a realization of a fracture/fault network on the scale of a reservoir. Each cell of the reservoir model thus represents a discrete fracture network delimiting a set of porous matrix blocks, of irregular shape and size, delimited by fractures. Such an image is shown in FIG. 3. This discrete fracture network constitutes an image representative of the real fracture network defining the matrix blocks.

Constructing a discrete fracture network in each cell of a reservoir model can be achieved using known modelling softwares, such as the FRACAFlow® software (IFP Energies nouvelles, France). These softwares use the statistical parameters determined in the fracture characterization stage.

Thus, within the discrete fracture network (DFN), each fracture is represented by a polygonal finite plane which is isotropic regarding its properties. that is, any property of the fault (hydraulic, such as the conductivities) is homogeneous in this plane. This plane can comprise at least one intersection segment corresponding to an intersection between the fracture and another fracture of the network.

3—Generation of a Double Medium Mesh (MAILDM)

At this stage, reservoir engineers want to carry out flow simulations to best calibrate the flow properties of the fracture network. There are many techniques available for generating such a mesh and solving flow equations.

Considering that the mass conservation equation holds in a fractured porous medium, and since Darcy's equation is assumed to hold in the matrix medium ($\Omega_M$) and in the fracture medium ($\Omega_F$) with the continuity of the normal flow at the matrix/fracture boundary $\partial\Omega_{FM}$ (with $\Omega_M \cup \Omega_F \cup \partial\Omega_{FM} = \Omega$), it can be stated:

$$\begin{cases} \phi_F \chi \frac{\partial P_F}{\partial t} - div\left(\overline{\frac{K_F}{\mu}} \vec{\nabla} P_F\right) = Q_F, & \text{in } \Omega_F \\ \phi_M \chi \frac{\partial P_M}{\partial t} - div\left(\overline{\frac{K_M}{\mu}} \vec{\nabla} P_M\right) = Q_M, & \text{in } \Omega_M \\ \overline{\frac{K_F}{\mu}} \cdot \vec{\nabla} P_F \cdot \vec{n}_F = \overline{\frac{K_M}{\mu}} \cdot \vec{\nabla} P_M \cdot \vec{n}_M, & \text{on } \partial\Omega_{FM} \end{cases}$$

where:
$P_{F,M}(x,y,z,t)$ are the respective pressures of each medium (fracture and matrix),
$Q_{F,m}(x,y,z,t)$ are the source terms;

$$\chi = c_R + c_{fl} = c_R + \sum_{i=fluide} S_{fl\_i} c_i$$

of the total compressibility of the medium;
$c_R$ is the compressibility of the rock;
$c_{fl}$ is the compressibility of the fluid;
$K_{F,M}(x, y, z)$ are the respective fracture and matrix permeabilities in space;
$\phi_{F,M}(x, y, z)$ is the respective porosities of the fracture and matrix media in space; and
$\mu$ is the viscosity of the fluid (constant).

Using the Green-Ostrogradski theorem allows this system to be rewritten in its integral form:

$$\begin{cases} \int_{\Omega_F} \phi_F \chi \frac{\partial P_F}{\partial t} + \int_{\partial\Omega_{FM}} \overline{\frac{K_F}{\mu}} \cdot \vec{\nabla} P_F \cdot \vec{n}_F \, dS = \int_{\partial\Omega_F} \overline{\frac{K_F}{\mu}} \cdot \vec{\nabla} P_F \cdot \vec{n}_{ext} \, dS \\ \int_{\Omega_M} \phi_M \chi \frac{\partial P_M}{\partial t} + \int_{\partial\Omega_{FM}} \overline{\frac{K_M}{\mu}} \cdot \vec{\nabla} P_M \cdot \vec{n}_M \, dS = \int_{\partial\Omega_M} \overline{\frac{K_M}{\mu}} \cdot \vec{\nabla} P_M \cdot \vec{n}_{ext} \, dS \\ \int_{\partial\Omega_{FM}} \overline{\frac{K_F}{\mu}} \cdot \vec{\nabla} P_F \cdot \vec{n}_M \, dS = \int_{\partial\Omega_{FM}} \overline{\frac{K_M}{\mu}} \cdot \vec{\nabla} P_M \cdot \vec{n}_M \, dS \\ \int_{\partial\Omega_F} \overline{\frac{K_F}{\mu}} \cdot \vec{\nabla} P_F \cdot \vec{n}_{ext} \, dS = \int_{\partial\Omega_F} Q_F \cdot \vec{n}_{ext} \, dS \\ \int_{\partial\Omega_M} \overline{\frac{K_M}{\mu}} \cdot \vec{\nabla} P_M \cdot \vec{n}_{ext} \, dS = \int_{\partial\Omega_M} Q_M \cdot \vec{n}_{ext} \, dS \end{cases}$$

3-a Generation of a Fracture Medium Mesh (FRAC)

According to a preferred embodiment, a method allowing generating a fine mesh on any discrete 3D fracture network with an optimum number of nodes, close to the number of intersections between the connected fractures, is used. The connectivity of the discrete fracture network (DFN) on the scale being studied (a zone of interest of several thousand square meters) is complied in order to simulate flows. This method of meshing each fracture plane in the 3D space is applicable to all the flow problems in a 2D plane with discontinuities as regards hydraulic properties. This method essentially comprises two stages:

a) constructing a Voronoi diagram on each fracture plane by positioning Voronoi cell centers on the intersection segments;

b) calculating transmissivities between the centers of neighboring cells from the ratio of the surface area of the neighboring cells to the distance between the neighboring cells;

The cells of the fractured mesh are constructed from a segment Voronoi diagram to limit to a single homogeneous medium the space of exchange between two fracture nodes while complying locally with the flow physics in a homogenous medium. The discontinuity due to any fracture intersection is modelled by the mesh construction. Once the nodes are positioned, a simple and physical formulation is used to calculate the transmissivities which are the connection terms between nodes. This method, applied here to the 3D fracture medium mesh, applies to any 3D problem of disordered heterogeneity segments connected by planes of homogeneous property.

Physically, it is assumed that the intersection between two fractures is a heterogeneity and the damage is assumed to be greater in each plane relative to the respective fractures. Now, in a homogeneous medium, the fluid will follow the path requiring the least energy to travel from one point to the next. Since it is assumed that the pressure gradient along the intersection is lower than in the fracture (higher permeability), to go from one intersection to the next, the fluid will follow the path with a shorter distance between the two intersection segments, which leads to calculation, for each fracture, of the 2D segment Voronoi diagram on the intersections. Indeed, this diagram affords the advantage of defining the zones of influence of each fracture.

1. The mesh of the fractured medium is generated, on the DFN, in order to have as few nodes as possible. In order to fully meet the connectivity, the fracture nodes are arranged on the intersections of the 3D fractures (one or more nodes per intersection segment).

2. The isopressures, orthogonal to the pressure gradient and thus to the current lines in each homogeneous fracture plane, are assumed to be parallel to the intersections.

3. The cells of the mesh are constructed from a segment Voronoi diagram on each fracture plane. This construction affords the advantage of:

Limiting, to a single homogeneous medium (the plane of a fracture), the space of exchange between two fracture nodes;

locally meeting the orthogonality between the current line (between two nodes) and the boundary of the cells; and facilitating the approximate calculation of the pressure gradient between the nodes along the boundary.

Figure 4:
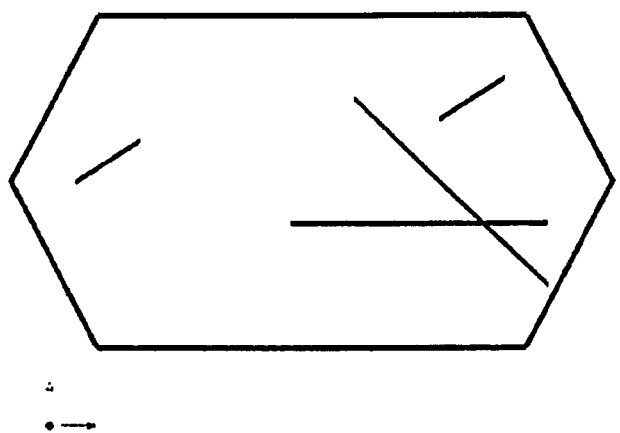
FIG. 4 illustrates an example of a fracture plane having six vertices and four coplanar intersection segments, including one multiple intersection with other fractures.
Figure 5:
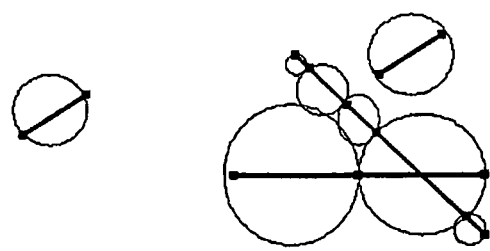
FIG. 5 illustrates the creation of the Voronoi cell centers for the example chosen (FIG. 4), according to the Koebe theorem.
Figure 6:
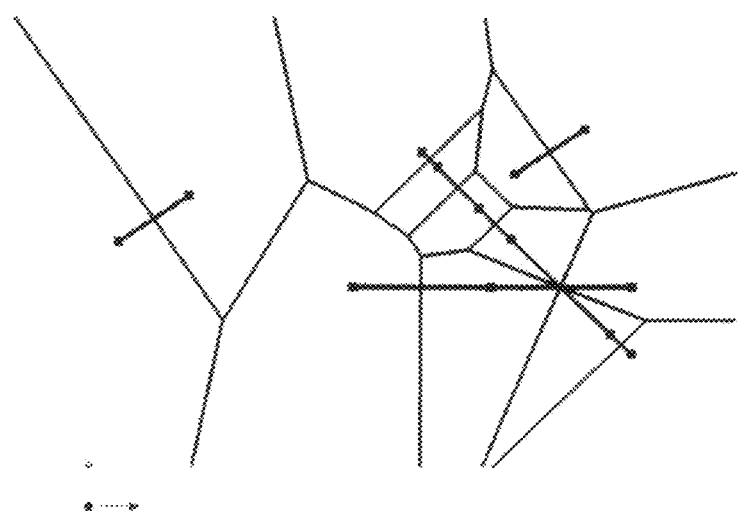
FIG. 6 illustrates the construction, from FIG. 5, of the infinite Voronoi diagram, with determination of the neighboring cells and boundaries.
Figure 7:
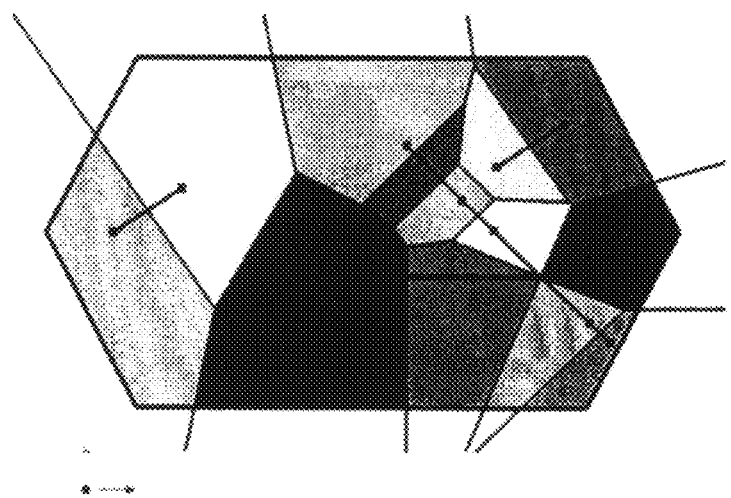
FIG. 7 illustrates the result of the dipping applied to the image of FIG. 6.
Figure 8:
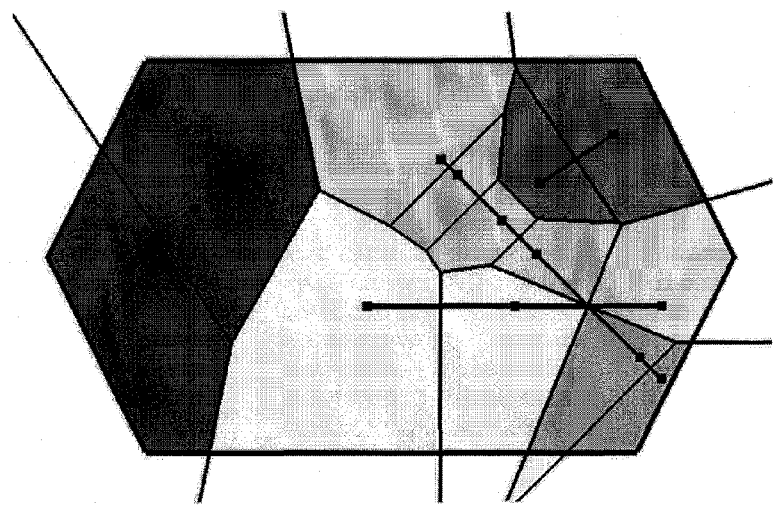
FIG. 8 illustrates the assembly of the Voronoi cells for creating the "fracture nodes" (here six "fracture nodes" characterized each by a color)

According to the invention, each fracture is represented by a polygonal finite plane isotropic regarding its dynamic properties. Each plane can comprise at least one intersection segment corresponding to an intersection between the fracture and another fracture of the network (DFN). FIG. 4 illustrates an example of a fracture with six vertices and four coplanar intersection segments, including a multiple intersection. The method for meshing this plane comprises the following stages:

1. For each intersection, creation of a fracture node (a node at the center of each intersection, the information is retained on the coordinates of both ends). In the case of a multiple intersection (three fractures at least intersect at the same point), the initial node at the center of the segment is replaced by two nodes on either side of the point. The goal of this preprocessing is to provide connexity for any fracture cell.
2. Construction of the Voronoi diagram on each fracture plane from the intersection segments by applying Koebe's theorem in which each segment is at least discretized by two intermediate Voronoi nodes at each end and refined in case of segments that are too dose or that intersect. This construction can be broken down into the following stages:
   i. Creation of all of the Voronoi cell centers with points satisfying the "kissing disks" theorem of Koebe-Andreev-Thurston (P. Koebe, Kontaktprobleme der konformen Abbildung, Ber. Sächs. Akad. Wiss. Leipzig, Math.-Phys. KL, 88:141-164, 1936) on each intersection contained in the plane of the fracture. Each segment is at least discretized by two intermediate Voronoi nodes at each end of the segment, and refined in the case of segments that intersect and segments that are too dose (the notion of closeness depends on the distance from which two points are assumed to merge. It is a geometric precision parameter that the user can define according to the size of the domain being studied in relation to the size of the fractures notably). FIG. 5 illustrates the creation of the Voronoi cell centers for the example chosen (FIG. 4), according to Koebe's theorem. It can be determined that, for each triplet of points, the circle whose center is the midpoint of two of the points does not contain the third point.
   ii. Construction of the Voronoi diagram on these points using S. Fortune's algorithm (S. J. Fortune, A Sweepline Algorith for Voronoi Diagrams, Algorithmica 2 (1987), 153-174), proved to be the fastest on an infinite 2D plane. FIG. 6 illustrates the construction of the infinite Voronoi diagram, with determination of the boundaries and the neighboring cells.
   iii. Clipping of the infinite Voronoi diagram with respect to the finite polygon defining the fracture. Clipping is confining a visual result to a given domain. At this stage, the Voronoi cells are convex and the line passing through the centers of two neighboring cells is orthogonal to the boundary that separates them. Such a geometry allows easier approximation of the pressure gradient between the nodes along the boundary. FIG. 7 illustrates the result of the clipping procedure applied to the image of FIG. 6.
3. Fine calculation of the transmissivities between the centers of the neighboring cells of the diagram
   The transmissivities (Tff) between the centers of neighboring cells are calculated from the ratio of the surface area (Sc) of the neighboring cells to the distance (Dc) between the neighboring cells:
   Tff equals K.Sc/Dc\with K the permeability of the fracture where the flow occurs.
4. Voronoi cells assembly
   It is assumed that the damage at the intersection between two fractures is greater than in the respective planes of the fractures. The conductivity discontinuities on the fracture plane are therefore taken into account locally along the intersections. The isopressure lines in each fracture plane then correspond to the equidistance lines between the intersection traces. The segment Voronoi diagram meets this criterion with the cells of this diagram becoming the fracture cells (connected by construction) associated with the node. To limit the number of nodes, the Voronoi cells are assembled belonging to the same intersection segment as long as the cell remains connected (that is, the cells belong to the same segment and there is no multiple intersection). FIG. 8 illustrates the assembly of the Voronoi cells in order to create the "fracture nodes" (here six "fracture nodes" are characterized each by a color).

Then, the volumes are summed and the transmissivity between two "fracture nodes" is equal to the sum of the transmissivities via the boundaries separating them according to the flow conservation. If a fracture node A contains several Voronoi points $P_{Ai}$ and a node B contains several Voronoi points $P_{Bj}$, the transmissivity between two fracture nodes A and B is calculated as the sum of the transmissivities between all the Voronoi cell pairs belonging to a node and having a common face (FIG. 8).

$$T_{AB} = \sum_{i,j} T(P_{A_i}, T_{B_j})$$

Figure 9:
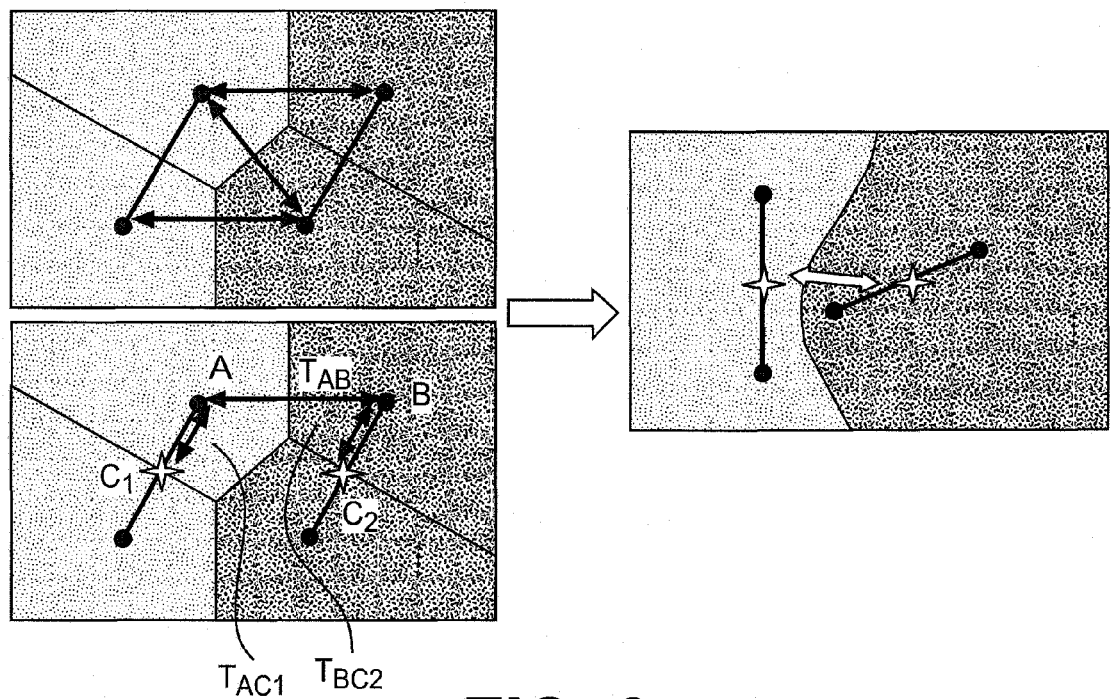
FIG. 9 illustrates the assembly of the Voronoi cells in cases where the "fracture node" does not correspond to the Voronoi nodes, with calculation of a correction of all the transmissivities.

In the case of assembly, when the "fracture node" does not correspond to the Voronoi nodes, a correction of all the transmissivities is carried out which accounts for the distance modifications for the fluid exchanges. This modification depends on the permeability assigned to each fracture intersection which can vary depending on the model from that of the calculation plane to infinity. It may be desirable to model a different permeability along the intersection of two fractures, without it being infinite, in relation to the one that defines each fracture plane. In order to find the correction linked with the finite conductivity of an intersection segment, a transmissivity is added between center C1 of the node (or, geometrically speaking, of the segment) and a Voronoi point $P_{Ai}$. Thus, if two Voronoi nodes (or more) belong to the same fracture node (FIG. 9) of center C1, the transmissivity $T_{S1S2}$ between a node A and a node B is calculated as follows:

$$T_{AB}^{corr} = \left( \frac{1}{T_{C_1 A_i}} + \frac{1}{T_{A_i B_j}} + \frac{1}{T_{C_2 B_j}} \right)^{-1}$$

This correction removes the hypothesis of infinite conductivity along the fracture if the selection of the model imposes $T_{C_1 A_i} \neq 0$.

In order to be used in a software and executed in a computer, the algorithm inputs can be as follows:

A zone of interest is a 3D parallelepiped given by the bounding box (Xmin, Ymin, Zmin, Xmax, Ymax, Zmax) of the simulation domain;

A list of the fractures (3D convex plane polygons given by lists of ordered vertices) with their isotropic hydraulic properties in each fracture plane (permeability, thickness, compressibility);

A connectivity table under boundary conditions (table indicating to which cluster (of maximum size) a fracture belongs. A cluster is a group of fractures for which there is a path connecting each member);

A list of the 3D intersection segments and for each fracture a list of pointers to the corresponding intersections. Each fracture intersection and vertex is expressed, through base change, in a local reference frame of the fracture. Thus, the 3D general problem is brought down to a succession of 2D plane problems.

This new fractured medium meshing technique allows generation of a fine mesh on the discrete fracture network with an optimum number of nodes which is, close to the number of intersections between the connected fractures.

The connectivity of the DFN on the scale being studied (a zone of interest of some thousand square meters) is complied in order to simulate flows;

the 3D cells of the fractured mesh are constructed from a segment Voronoi diagram discretized according to Koebe's theorem on each fracture plane. This construction affords the advantage of:

- limiting to a single homogeneous medium (the plane of a fracture) the space of exchange between two fracture nodes;
- locally meeting the orthogonality between the current line (between two nodes) and the boundary of the cells and for readily calculating the pressure gradient between the nodes along the boundary;
- taking into account the discontinuity due to any fracture intersection; and
- being broken down into simple and readily parallelizable stages.

This new fractured medium meshing technique is a semi-analytical method using a Voronoi diagram for reducing the number of nodes required for flow simulation on a discrete fracture network. The method according to the invention is therefore applicable to larger calculation areas than previous methods.

The results of the meshing method (nodes, volume and associated transmissivities) can then be used with a double medium approach for simulating well tests, interference tests or an equivalent permeability calculation. This method, applied to the meshing of a 3D fractured medium, applies to any homogeneous plane problem populated with heterogeneity segments.

The discretization of double medium flow equations is understood of be (the discrete pressures of each cell N are denoted by $P_{M,N}$ and $P_{F,N}$.

Evaluation of the pressure variation for a time $\Delta t$ is obtained via a time-implicit scheme, which leads to:

$$\begin{cases} \int_{\Omega_F} \phi_F \chi \frac{P_F^{j+1} - P_F^j}{\Delta t} d\Omega - \int_{\partial\Omega_{FM}} \frac{\overline{K_F}}{\mu} \cdot \vec{\nabla} P_F^{j+1} \cdot \vec{n}_M \, dS = \int_{\partial\Omega_F} Q_F^{j+1} \cdot \vec{n}_{ext} \, dS \\ \int_{\Omega_M} \phi_M \chi \frac{P_M^{j+1} - P_M^j}{\Delta t} d\Omega + \int_{\partial\Omega_{FM}} \frac{\overline{K_M}}{\mu} \cdot \vec{\nabla} P_M^{j+1} \cdot \vec{n}_M \, dS = \int_{\partial\Omega_M} Q_M^{j+1} \cdot \vec{n}_{ext} \, dS \end{cases}$$

The spatial pressure variation is then evaluated by a finite-volume numerical approach:

$$\begin{cases} \sum_n \phi_{F,n} \chi \frac{P_{F,n}^{j+1} - P_{F,n}^j}{\Delta t} |\Omega_{F,n}| + \sum_n \sum_k T_{FF,nk}(P_{F,n}^{j+1} - P_{F,k}^{j+1}) + \sum_n \sum_l T_{FM,nl}(P_{F,n}^{j+1} - P_{M,l}^{j+1}) = \sum_n Q_{Fn}^{j+1} \\ \sum_n \phi_{M,n} \chi \frac{P_{M,n}^{j+1} - P_{M,n}^j}{\Delta t} |\Omega_{M,n}| + \sum_n \sum_k T_{MM,nk}(P_{M,n}^{j+1} - P_{M,k}^{j+1}) + \sum_n \sum_l T_{FM,nl}(P_{M,n}^{j+1} - P_{F,l}^{j+1}) = \sum_n Q_{Mn}^{j+1} \end{cases}$$

To simulate well tests, there is a compressibility effect and a flow Q is imposed where measurements are taken for each well. Pressure boundary conditions can be applied on the faces of the parallelepiped being studied. The system is then preprocessed to be reduced to n independent equations:

$$\left[ \begin{array}{c} -\frac{T_{ij}}{\mu} \\ \left( \chi \frac{\Phi_i V_i}{\Delta t^n} + \sum_{k \neq i} \frac{T_{ki}}{\mu} \right) \\ -\frac{T_{ij}}{\mu} \end{array} \right] \cdot (P_i^n) = \left( Q_{ilim} + \sum_{0,nblim} \frac{T_{i,jlim}}{\mu} P_{jlim} \right) + \left( \chi \frac{\Phi_i V_i}{\Delta t^n} P_i^{n-1} \right)$$

where:

$P_{j,lim}$ is the limit pressure imposed on the temporary node j_lim;
$P_i^n$ is the pressure unknown in node i at the time n;
$\chi$ is the total compressibility (medium+fluid);
$\Delta t^n$ is the current time interval; and
$V_i$ is the volume of node i.

The system thus is, by construction, diagonally dominant.

To calculate equivalent permeabilities (MAE) for each reservoir cell with the equivalent permeabilities being used subsequently in the flow simulator on reservoir scale, the same boundary conditions as described in French Patent 2,757,947 are used. The following discrete numerical system then has to be solved:

$$\left[ \begin{array}{c} -T_{ij} \\ \sum_{k \neq i} T_{ki} \\ -T_{ij} \end{array} \right] \cdot (P_i) = \left( \sum_{0,nblim} T_{i,jlim} P_{j,lim} \right)$$

where:

$p_{j,lim}$ is the limit pressure imposed on node j_lim for a given pressure gradient (this term varies for the 3 systems solved); and
$P_i$ is pressure unknown in node i.

The system thus is, by construction, diagonally dominant, and independent of compressibility and viscosity.

3-b Generation of a Matrix Medium Mesh (MAT)

Double medium flow simulation also requires discretizing the matrix medium and calculating terms of exchange between the matrix medium and the fracture medium. The necessity of constraining the pressure field of the matrix medium to the fracture network leads us to providing a new 3D discretization method for the matrix medium controlled by the geometry of the 3D simulation DFN and its heterogeneities in space for example (therefore the heterogeneities of the fracture medium).

Indeed, the pressure field of the matrix medium in a reservoir cell depends, a priori, on the position of the fractures and on the hydraulic conductivity ratio between the matrix medium and the fracture medium. Notably, the fracture medium is assumed to be more conductive than the matrix medium. Therefore, for the same flow rate in a short time interval, the pressure variation in the fracture medium can be disregarded in relation to that in the matrix medium. It is then assumed that the isopressures are parallel to the fracture planes in the matrix medium. That is, for the same distance (possibly corrected by the permeability of the matrix medium) with respect to the fracture medium, the pressure is assumed to be constant in the matrix medium. This hypothesis allows defining the direction of the pressure gradient in the matrix medium and it facilitates calculation of the exchange terms.

To discretize the matrix medium, an Octree type algorithm is used. An octree is a tree type data structure in which each node can have up to eight children (octants). Octrees are most often used for partitioning a three-dimensional space by subdividing it recursively into eight octants.

Thus, in order to construct the cells of the matrix medium within a cell of the reservoir model (obtained from the reservoir discretization), the cell is divided into eight cells. Then, if necessary, each one of these eight cells is divided into eight cells, and the process continues until the mesh obtained is satisfactory.

The octree division technique is carried out as follows:
Algorithm Input
A zone of interest is a 3D parallelepiped (all or part of the reservoir model) given by the bounding box (Xmin, Ymin, Zmin, Xmax, Ymax, Zmax) of the simulation domain;
A list of the fracture cells with their geometric (intersection segments between fractures for example) and hydraulic properties; and
Properties (porosity, permeability, compressibility) of the matrix medium at any point of the zone being studied.
Refinement Conditions
Refinement corresponds to the division into eight octants. According to the invention, the refinement condition (condition for a cell to be again split in eight) is the number of fracture nodes (or any other strong hydraulic discontinuity) present in the calculation rectangular parallelepiped (cell resulting from a division).

The reservoir cell is thus divided into eight, and each cell resulting from this first division is split in eight again, until each cell resulting from a division comprises a number of fractures below or equal to a given threshold (refinement condition).

Thus, the more general problem is split up into simplified problems of a parallelepipedic matrix cell (the cell resulting from the last division) and of a limited number of fractures traversing it. In other words, the matrix is meshed more finely in areas of higher complexity (in the sense of the fracturation).

According to the terminology of the Octree type algorithm, what is referred to as the "octree leaf" is the object of the tree that can no longer be subdivided considering the refinement condition of the octree. It is therefore, according to the invention, a cell resulting from the last division (cell having less fractures than a given threshold).

The octree leaves are intended to become the cells of the matrix medium. It is therefore important to keep a parallelepiped size of the same order of magnitude among neighbors (~50%) to allow good flow simulations using known softwares as flow simulators. The octree constructed according to the invention is thus a first-order balanced octree. This constraint on the construction of the octree means that the level difference (number of subdivisions required to access the current leaf, the root being of level 0) between two neighboring leaves in the octree cannot exceed one. Thus, each matrix node cannot have more than four neighbors in each one of the six directions.

According to a preferred embodiment, a third constraint is added to construct the octree which is a refinement condition linked with a memory limit. Thus, a maximum number of cells of the matrix medium can be set. When the number of leaves reaches this level, the division stops.

Once the octree is constructed, each leaf corresponds to a parallelepipedic cell resulting from one or more divisions. The node of the matrix medium is then placed at the center of these cells.

Thus, the matrix medium mesh is generated by meeting a constraint linked with the high discontinuities of the fracture medium, using a first-order balanced octree with a refinement constraint on the number of fractures per leaf. Each octree leaf carries the information on the fracture nodes (and therefore their geometry) traversing it. The neighborhood information is contained in the octree and the fact that the octree is a first-order balanced octree facilitates calculation of the exchange terms.

Figure 11:
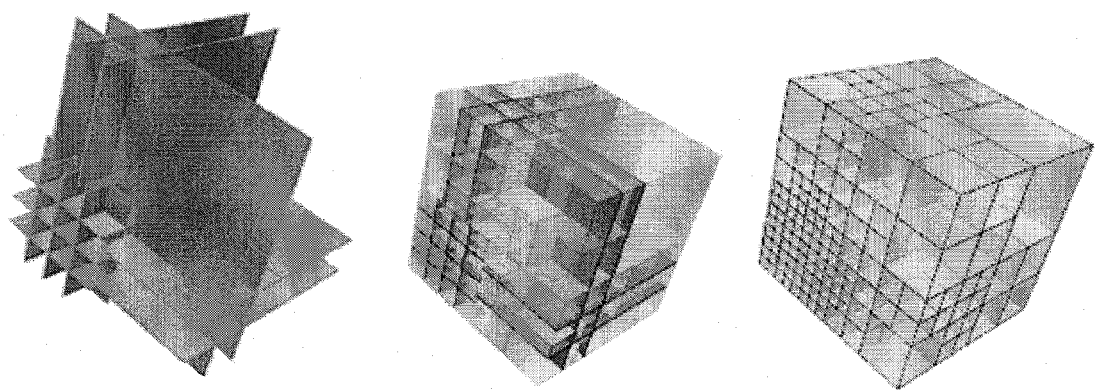
FIG. 11 shows a matrix mesh applied to a DFN.

FIG. 11 shows a matrix mesh applied to a DFN, from left to right, which is a fracture density network variable in space, a matrix zone associated with the DFN for octree-based cutting, and the mesh of the matrix medium (corresponding to the left-hand network) is generated according to the method of the invention.

Computation of the Matrix/Fracture Exchange Terms

According to a first possible configuration, a matrix node exchanges with several fracture nodes.

The principle of flow conservation in the considered cell provides the expression:

$$Q_{MF} = \sum_{i=1\ldots k} Q_{MF_i} \qquad \text{Eq 2}$$

where the flow exchanged between the matrix cell and fracture node i $Q_{MF_i}$ is:

$$Q_{MF_i} = \frac{T_{MF_i}}{\mu} \cdot (P_{Fi} - P_M) = \frac{1}{\mu} \int_{\partial \Omega_{Fi}} \overline{\overline{K_M}} \cdot \vec{\nabla} P \cdot \vec{n}_{Fi} \, dS \qquad \text{Eq 3}$$

hence the transmissivity between matrix node M and fracture node Fi:

$$T_{MF_i} = \frac{\int_{\partial \Omega_{Fi}} \overline{\overline{K_M}} \cdot \vec{\nabla} P \cdot \vec{n}_{Fi} \, dS}{(P_{Fi} - P_M)} \approx \frac{2 S_{MF_i} \overline{\overline{K_M}} n_{Fi} \cdot n_{Fi}}{\langle l_{mFi} \rangle_{\Omega_{M_i}}} \qquad \text{Eq 4}$$

The volume of influence of fracture node i, $\Omega_{M_i}$, is all the points of the matrix cell whose closest fracture node is fracture node i. It is assumed that no flow circulates between these volumes of influence. They are limited by hypothesis with isopressure equidistant from the fracture nodes.

$\langle l_{mFi} \rangle_{\Omega_{M_i}}$ is the average distance with respect to fracture node i on $\Omega_{M_i}$.

The volume of influence can be calculated as follows:

By hypothesis, the pressure gradient is parallel to the normal to the fractures. During a short time interval, the pressure in the fracture medium varies little over space with its first-order approximation being obtained by its average pressure. To evaluate a matrix local pressure in the cell, assuming that the pressure field in the matrix varies linearly as a function of the minimum distance to the fracture, Taylor's formula as follows is used:

$$P_M(\cdot) = P_F + \nabla P_M(\cdot) \cdot l_{MF}(\cdot) n_F(\cdot) \qquad \text{Eq 1}$$

The zones of influence, $\Omega_{M_i}$, associated with each fracture present in the matrix cell considered, are determined by a stochastic algorithm which:

draws random points in the matrix cell (in each one of the 8 octants), for each point by computing the distance to each finite fracture plane;

assigns the random points to the closest fracture node to evaluate the volumes of influence; and assigns the distance to the octant and computes the average matrix/fracture distance in each octant.

The result of this algorithm is as many density (distance) functions as there are fracture nodes and an average matrix/fracture distance in each octant. The average matrix/fracture distance $\langle l_{mFi} \rangle_{\Omega_{M_i}}$ and the matrix volumes associated with the fracture node are then readily computable for each fracture node. It is possible to also weigh them by a time term to be explicit for modelling the transient flow.

According to a second possible configuration, no fracture node belongs to the volume associated with the matrix node.

In the case of double medium flows (fractures+matrix), if no fracture traverses the matrix cell, the matrix cell being considered supplies the fracture network only via the matrix/matrix exchange.

For the simple medium (fractures only), the volume of influence of the cell is added to the one that exchanges with the closest fracture (via the volume function associated with a fracture node).

Computation of the Matrix/Matrix Exchange Terms

By using a first-order balanced construction of the octree, in each one of the six directions, it is ensured that a cell can have 1 or 4 neighboring cells per face.

The main difficulty for matrix/matrix transmissivity computation is linked with the fact that the lines of the isopressures $P_M$ are correlated with the geometry of the fractures so that the macroscopic pressure gradient is therefore also is in the cell.

The cell has a single neighbouring cell in direction X $$T_{ij} = \frac{(K_i + K_j) \Delta Y \Delta Z}{L}$$

The cell has four neighbouring cells in direction X $$\frac{1}{T_{ij}} = \frac{L}{\Delta Y} \cdot \frac{1}{(\Delta X_i + \Delta X_j) \cdot \Delta Z} \left[ \frac{\Delta X_i}{K_i} + \frac{\Delta X_j}{K_j} \right] \qquad \text{Eq 5}$$

Figure 10:
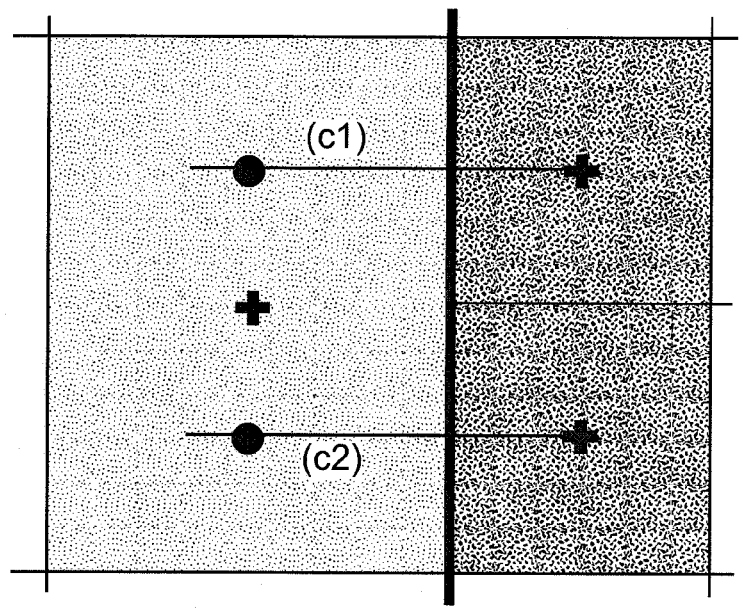
FIG. 10 shows a three matrix mesh of cells of different sizes.

FIG. 10 illustrates three matrix mesh cells of different size where the thick line represents the boundary between the cells, a cross represents the center of a cell and a circle represents the center of a pseudocell.

5—Calibration of the Flow Properties of the Fractures and of the Matrix Medium

Fracture Medium

The next stage determines the flow properties of the initial fractures (conductivity and opening of the fractures) and then calibrates these properties with well test simulations on discrete local flow models which are inherited from the realistic image of the real (geological) fracture network on the reservoir scale. Although it covers only a limited area (drainage area) around the well, such a well test simulation model still comprises numerous computation nodes if the fracture network is dense. The size of the systems to be solved and/or the duration of the computations therefore often remain prohibitive.

Calibration of the fracture flow properties (conductivity and opening of the fractures), locally around the wells, requires, if necessary, the simulation of well tests.

This type of calibration is well known. The method described in French Patent 2,787,219 can for example be used. The flow responses of some wells (transient or pseudo-permanent flow tests, interferences, flow rate measurement, etc.) are simulated by these models extracted from the geological model giving a discrete (realistic) image of the fractures supplying these wells. The simulation result is then compared with the real measurements performed in the wells. If the results differ, the statistical parameters (PSF) describing the fracture networks are modified, then the flow properties of the initial fractures are redetermined and a new simulation is carried out. The operation is repeated until the simulation results and the measurements agree.

The results of these simulations allow calibration of (estimate) the geometry and the flow properties of the fractures such as the conductivities of the fracture networks of the reservoir being studied and the openings.

6—Simulation of the Fluid Flows (SIM) and Calibration of the Fracture Medium Properties (OPT)

6-a Method without the Scaling Stage

At this stage, the reservoir engineer has all the data required for constructing the flow model on the scale of a ZOI or of a reservoir cell. The image models the fracture network by a discrete fracture network (DFN) where each fracture is for example meshed with the Voronoi cells containing transmissivity data (invention). According to the process selected by the reservoir engineer, two types of simulation can be carried out which are a short-term well test simulation allowing calibration of the properties of the near-well model which is selected.

The model used for flow simulation on the 3D mesh is based on the following hypotheses:

the flows are single-phase flows;
the fluid and the rock are weakly compressible;
the temperature varies little in the reservoir;
the fluid viscosity is constant in the reservoir;
the flows in porous media follow Darcy's law in the matrix and the fractures; and
gravity is disregarded but pressure P can be replaced by (P+ρgz) for the well test simulations with a suitable postprocessing.

If the computer capacities permit, due to the small number of nodes resulting from the provided method, consideration may be carrying out of simulations directly on the fracture network using the method according to the invention.

6-b Simulation of the Fluid Flows (SIM) and Optimization of the Reservoir Production Conditions (OPT)

At this stage, the reservoir engineer has all the data required for constructing the flow model on the reservoir scale. The hydraulic properties of fractures are calibrated near wells and scaled in a form of equivalent permeabilities over all of the reservoir cells. The fractured reservoir simulations often adopt the "double-porosity" approach proposed for example by Warren J. E. et al. in "The Behavior of Naturally Fractured Reservoirs", SPE Journal (September 1963), 245-255, according to which any elementary volume (cell of the reservoir model) of the fractured reservoir is modelled in a form of a set of identical parallelepipedic blocks, referred to as equivalent blocks, defined by an orthogonal system of continuous uniform fractures oriented in the principal directions of flow. The fluid flow on the reservoir scale occurs through the fractures only and fluid exchanges take place locally between the fractures and the matrix blocks. The reservoir engineer can for example use the methods applied to the entire reservoir this time in French Patent 2,757,947 corresponding to U.S. Pat. No. 6,023,656, and French Patent 2,757,957 corresponding to U.S. Pat. No. 6,064,944 and EP 2,037,080.

The reservoir engineer chooses a production process, such as, for example, the waterflooding recovery process, for which the optimum implementation scenario remains to be specified for the field being considered. The definition of an optimum waterflooding scenario is, for example, setting the number and the location (position and spacing) of the injector and producer wells in order to best take account for the impact of the fractures on the progression of the fluids within the reservoir.

According to the scenario that is selected, which is the double-medium image of the reservoir and to the formula relating the mass and/or energy exchange flow to the matrix-fracture potential difference, it is then possible to simulate the expected hydrocarbon production by the flow simulator (software) referred to as double-medium simulator.

At any time t of the simulated production, from input data E(t) (fixed or simulated-time varying data) and from the formula relating exchange flow (f) to potential difference ($\Delta\Phi$), the simulator solves all the equations specific to each cell and each one of the two grids of the model (equations involving the matrix-fracture exchange formula described above) and thus delivers the solution values to the unknowns S(t) (saturations, pressures, concentrations, temperature, etc.) at time t. This solution provides knowledge of the amounts of oil produced and of the state of the reservoir (pressure distribution, saturations, etc.) at the time being considered.

7—Optimized Reservoir Development (EXPLO)

The image of the fluid reservoir and a flow simulator are used to optimize the development of the fluid reservoir. Selecting various scenarios characterized, for example, by respective sites for the injector and producer wells and simulating the hydrocarbon production for each one according to stage 6, enables selection of the scenario allowing the production of the fractured reservoir being considered to be optimized according to the technical and economic criteria selected.

Then development of the reservoir according to this scenario is selected allowing the reservoir production to be optimized.

Variant

According to an embodiment, a tree type structure is also used during discretization of the fracture medium. In stage a) of the generation of the fracture medium (FRAC), a Voronoi diagram is constructed on each fracture plane by positioning Voronoi cell centers on the intersection segments. The octree allows acceleration of the construction of the fracture medium mesh by limiting the number of intersection computations.

An octree as described in stage 3b is then constructed, but not necessarily balanced at this stage. The refinement conditions are the number of subdivisions (in order to set the maximum number of leaves) and the number of fractures associated with a leaf.

An accelerated computation of the intersections between the 3D fractures is then performed using the octree because the number of fractures is reduced in each subdivision.

Along with the matrix/matrix exchange terms computation, the construction of the octree allows spatially splitting the fractures having no interactions. Only the fractures belonging to the same octree leaf will be subjected to a fracture/fracture transmissivity computation according to the method described above. The costly 3D computation of the fracture/fracture intersections is thus limited to the spatially neighboring fractures.

The algorithm provided also has the specific feature of allowing and facilitating parallelization of the computations at several levels:
  computation of the intersections between fractures,
  computation of the fracture/fracture exchange terms, and
  computation of the fracture/matrix exchange terms.

Advantages

The present double medium meshing method overcomes the restrictive hypothesis of having as many fracture nodes as matrix nodes while preserving the volumes in place and the flow physics by use of an upwind scheme.

Using tree type structures (and in particular the octree) allows acceleration of the construction of the fracture medium mesh (limitation of the number of intersection computations) to simplify the matrix/fracture exchange term computations and to properly estimate the matrix volumes associated with the fracture nodes.

This method, applied here to the meshing of a 3D double medium, applies to any dual problem involving high heterogeneities.

The invention claimed is:

1. A method for optimizing the development of a fluid reservoir traversed by a fracture network, wherein the reservoir is discretized into a set of cells, each cell comprising a matrix medium and a fracture medium, and a discrete fracture network is constructed in each cell from observations of the reservoir, comprising:
  generating a mesh of the discrete fracture network by defining a set of cells for each fracture, each fracture being represented within the discrete fracture network by a polygonal finite plane which is isotropic regarding dynamic properties thereof and the plane comprises at least one intersection segment corresponding to an intersection between a fracture and another fracture of the network, a Voronoi diagram being constructed on each fracture plane by positioning Voronoi cell centers on the at least one intersection segment;
  generating a mesh of the matrix medium by dividing each cell by an octree technique, wherein a cell is divided into eight cells and cells resulting from a division being themselves split in eight, until each cell resulting from a division comprises a number of fractures below or equal to a given threshold;

determining transmissivities between the cells of the mesh of the discrete fracture network by calculating transmissivities between neighboring Voronoi cell centers from a ratio of surface area of neighboring cells to a distance between the neighboring cells, transmissivities between the cells of the mesh of the matrix medium, and transmissivities between cells of the mesh of the discrete fracture medium and cells of the mesh of the matrix medium;

using the cells and the transmissivities for generating an image of the fluid reservoir; and using the image of the fluid reservoir and a flow simulator implemented with a computer for optimizing the development of the fluid reservoir.

2. A method as claimed in claim 1, wherein the mesh of the matrix medium is generated by a first-order balanced octree technique.

3. A method as claimed in claim 2, wherein the cells resulting from a division are themselves split in eight, until each cell resulting from a division comprises a number of fractures below or equal to a given threshold, or until a number of cells is below or equal to a given threshold.

4. A method as claimed in claim 3, wherein the transmissivities between the cells of the mesh of the matrix medium and the fracture medium are determined as a function of a volume of influence $\Omega_{M_i}$ of a fracture node i defined as all of the points of a cell of the mesh of the matrix medium whose closest fracture node is fracture node i, and as a function of an average distance $$\langle l_{mFi} \rangle_{\Omega_{M_i}}$$

to fracture node i on $\Omega_{M_i}$, while assuming that no flow circulates between the volumes of influence.

5. A method as claimed in claim 2, wherein the transmissivities between the cells of the mesh of the matrix medium and the fracture medium are determined as a function of a volume of influence $\Omega_{M_i}$ of a fracture node i defined as all of the points of a cell of the mesh of the matrix medium whose closest fracture node is fracture node i, and as a function of an average distance $$\langle l_{mFi} \rangle_{\Omega_{M_i}}$$

to fracture node i on $\Omega_{M_i}$, while assuming that no flow circulates between the volumes of influence.

6. A method as claimed in claim 1, wherein the cells resulting from a division are themselves split in eight, until each cell resulting from a division comprises a number of fractures below or equal to a given threshold, or until a number of cells is below or equal to a given threshold.

7. A method as claimed in claim 6, wherein the transmissivities between the cells of the mesh of the matrix medium and the fracture medium are determined as a function of a volume of influence $\Omega_{M_i}$ of a fracture node i defined as all of the points of a cell of the mesh of the matrix medium whose closest fracture node is fracture node i, and as a function of an average distance $$\langle l_{mFi} \rangle_{\Omega_{M_i}}$$

to fracture node i on $\Omega_{M_i}$, while assuming that no flow circulates between the volumes of influence.

8. A method as claimed in claim 1, wherein the transmissivities between the cells of the mesh of the matrix medium and the fracture medium are determined as a function of a volume of influence $\Omega_{M_i}$ of a fracture node i defined as all of the points of a cell of the mesh of the matrix medium whose closest fracture node is fracture node i, and as a function of an average distance $$\langle l_{mFi} \rangle_{\Omega_{M_i}}$$

to fracture node i on $\Omega_{M_i}$, while assuming that no flow circulates between the volumes of influence.

9. A method as claimed in claim 1, wherein the Voronoi cell centers are positioned on the at least one intersection segment when each intersection segment is at least discretized by two intermediate Voronoi nodes at each end of the segment and is refined for close segments and intersecting segments.

10. A method as claimed in claim 9, wherein a number of cells is limited by assembling the Voronoi cells belonging to a same intersection segment, when a cell resulting from the assembly remains connected.

11. A method as claimed in claim 10, wherein transmissivity between two cells resulting from the assembly is equal to a sum of the transmissivities via boundaries between the two cells according to flow conservation.

12. A method as claimed in claim 11, wherein the at least one intersection segment is determined by an octree technique wherein a cell is divided into eight cells, cells resulting from a division are themselves split in eight, until each cell resulting from a division comprises a number of fractures below or equal to a given threshold.

13. A method as claimed in claim 9, wherein the at least one intersection segment is determined by an octree technique wherein a cell is divided into eight cells, the cells resulting from a division are themselves split in eight, until each cell resulting from a division comprises a number of fractures below or equal to a given threshold.

14. A method as claimed in claim 10, wherein the at least one intersection segment is determined by an octree technique wherein a cell is divided into eight cells, cells resulting from a division are themselves split in eight, until each cell resulting from a division comprises a number of fractures below or equal to a given threshold.

15. A method as claimed in claim 1, wherein a number of cells is limited by assembling Voronoi cells belonging to a same intersection segment, when a cell resulting from the assembly remains connected.

16. A method as claimed in claim 15, wherein transmissivity between two cells resulting from an assembly is equal to a sum of the transmissivities via boundaries between the two cells according to flow conservation.

17. A method as claimed in claim 16, wherein the at least one intersection segment is determined by an octree technique wherein a cell is divided into eight cells, cells resulting from a division are themselves split in eight, until each cell resulting from a division comprises a number of fractures below or equal to a given threshold.

18. A method as claimed in claim 15, wherein the at least one intersection segment is determined by an octree technique wherein a cell is divided into eight cells, cells resulting from a division are themselves split in eight, until each cell resulting from a division comprises a number of fractures below or equal to a given threshold.

19. A method as claimed in claim 1, wherein the at least one intersection segment is determined by an octree technique wherein a cell is divided into eight cells, the cells resulting from a division are themselves split in eight, until each cell resulting from a division comprises a number of fractures below or equal to a given threshold.

* * * * *